(12) United States Patent
Ueda

(10) Patent No.: US 7,760,543 B2
(45) Date of Patent: Jul. 20, 2010

(54) RESISTANCE CHANGE MEMORY

(75) Inventor: Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 12/244,036

(22) Filed: Oct. 2, 2008

(65) Prior Publication Data

US 2009/0091969 A1 Apr. 9, 2009

(30) Foreign Application Priority Data

Oct. 3, 2007 (JP) ............................. 2007-260241

(51) Int. Cl.
*G11C 11/02* (2006.01)
*G11C 11/14* (2006.01)
*G11C 7/02* (2006.01)

(52) U.S. Cl. .................. 365/158; 365/171; 365/210.1; 365/210.15

(58) Field of Classification Search .................. 365/158
See application file for complete search history.

(56) References Cited

U.S. PATENT DOCUMENTS

| | | | |
|---|---|---|---|
| 5,695,864 A | 12/1997 | Slonczewski | |
| 6,473,336 B1 * | 10/2002 | Nakajima et al. | 365/171 |
| 6,678,198 B2 * | 1/2004 | Issa et al. | 365/207 |
| 6,738,285 B2 * | 5/2004 | Tanizaki et al. | 365/158 |
| 6,829,158 B2 | 12/2004 | Naji | |
| 7,277,339 B2 * | 10/2007 | Edahiro | 365/203 |
| 7,672,155 B2 * | 3/2010 | Kim et al. | 365/158 |
| 2004/0100835 A1 * | 5/2004 | Sugibayashi et al. | 365/200 |
| 2009/0010045 A1 * | 1/2009 | Ueda | 365/158 |

* cited by examiner

*Primary Examiner*—Son L Mai
(74) *Attorney, Agent, or Firm*—Oblon, Spivak, McClelland, Maier & Neustadt, L.L.P.

(57) ABSTRACT

A resistance change memory includes a memory cell which is connected to a first node, and programmed from a first resistance state to a second resistance state, a first replica cell which is connected to a second node, generates a write voltage for programming from the first resistance state to the second resistance state, and is fixed in the first resistance state, and a first constant-current source connected to the second node, wherein when writing the second resistance state in the memory cell, a voltage of the first node is held equal to that of the second node.

20 Claims, 12 Drawing Sheets

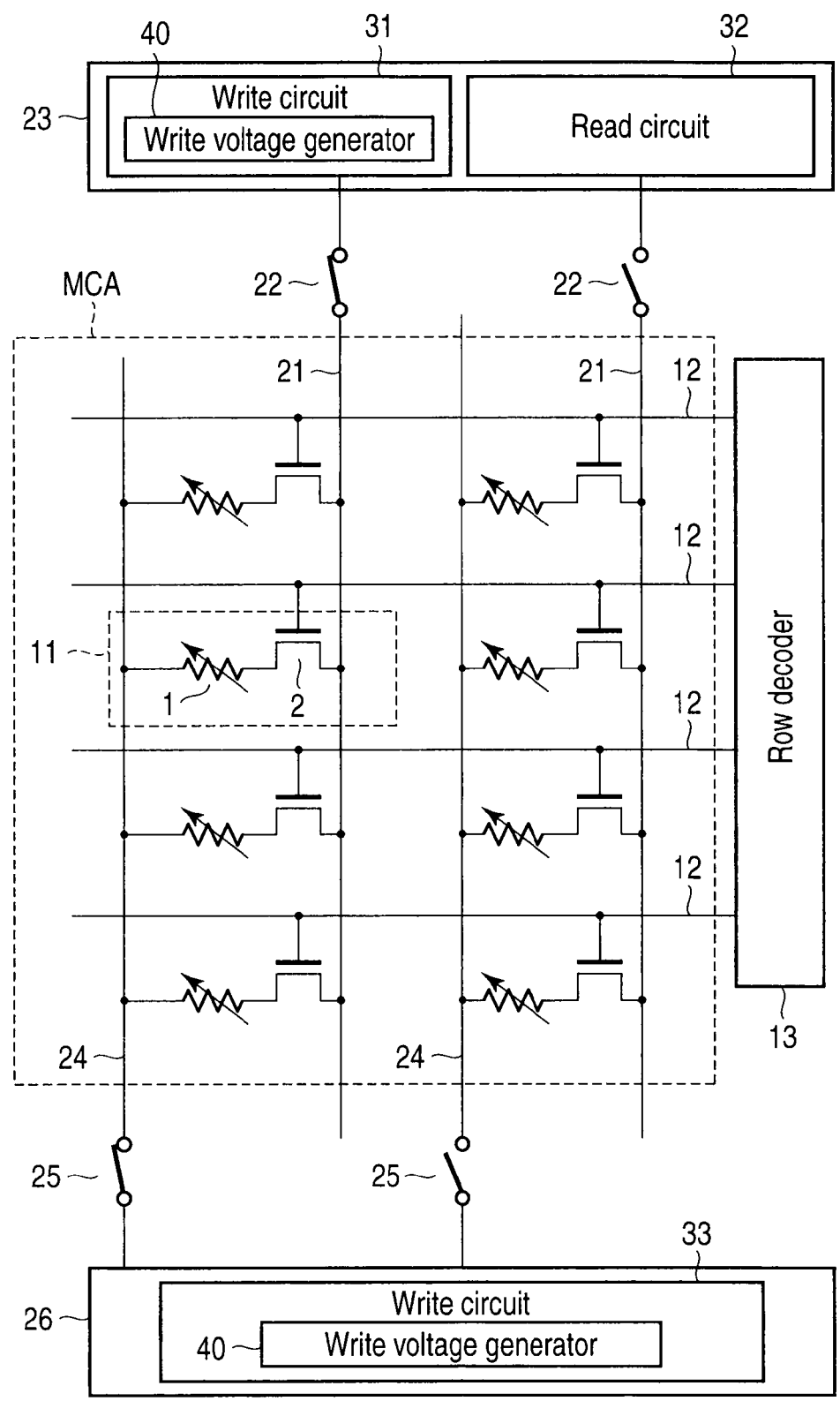
F I G. 1

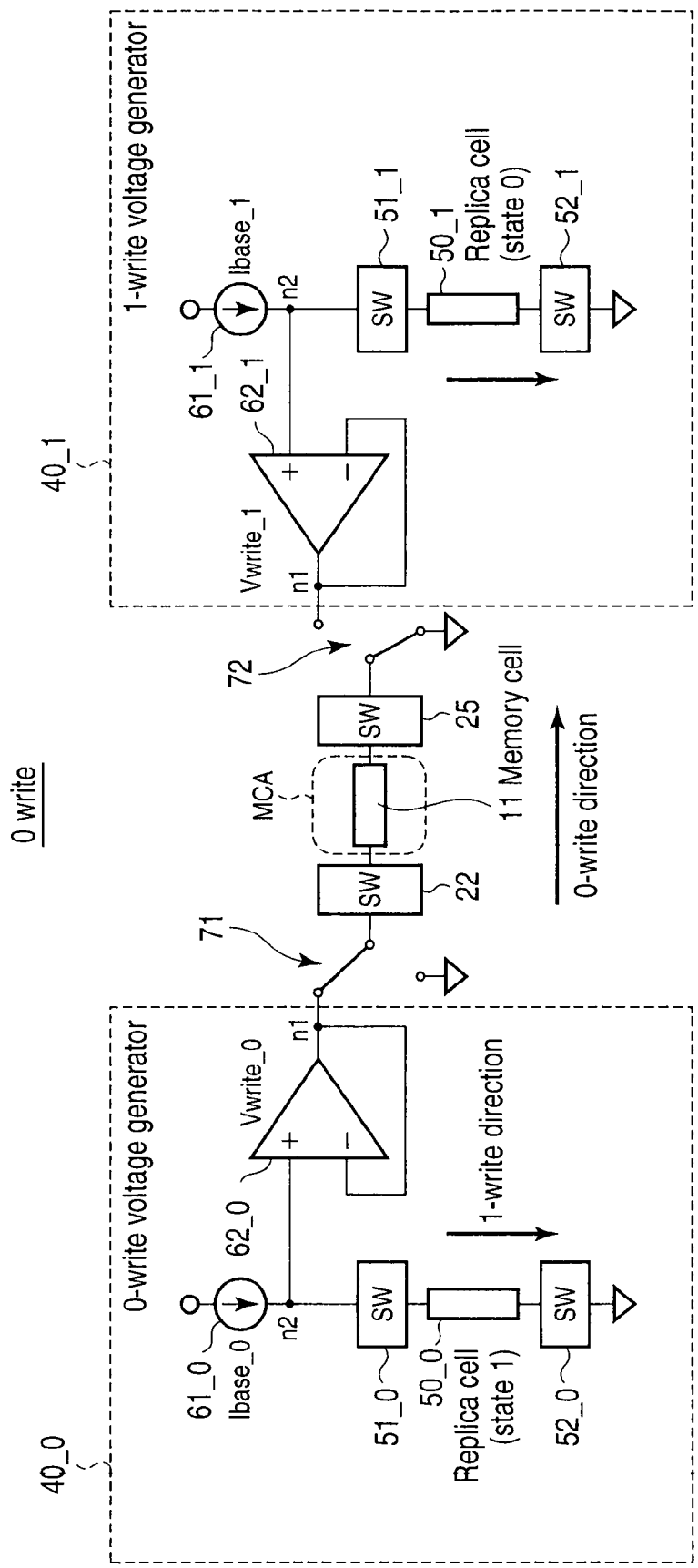
F I G. 6

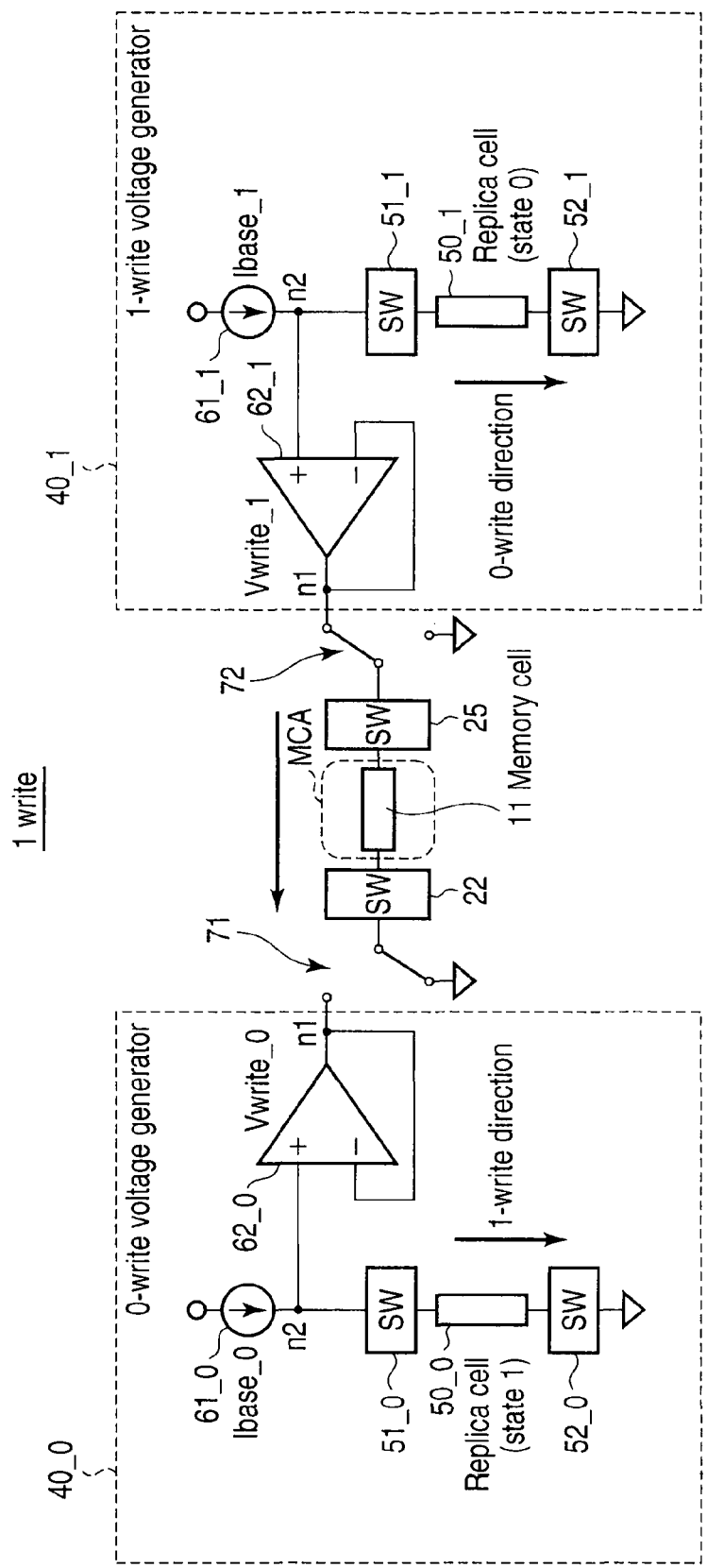
F I G. 7

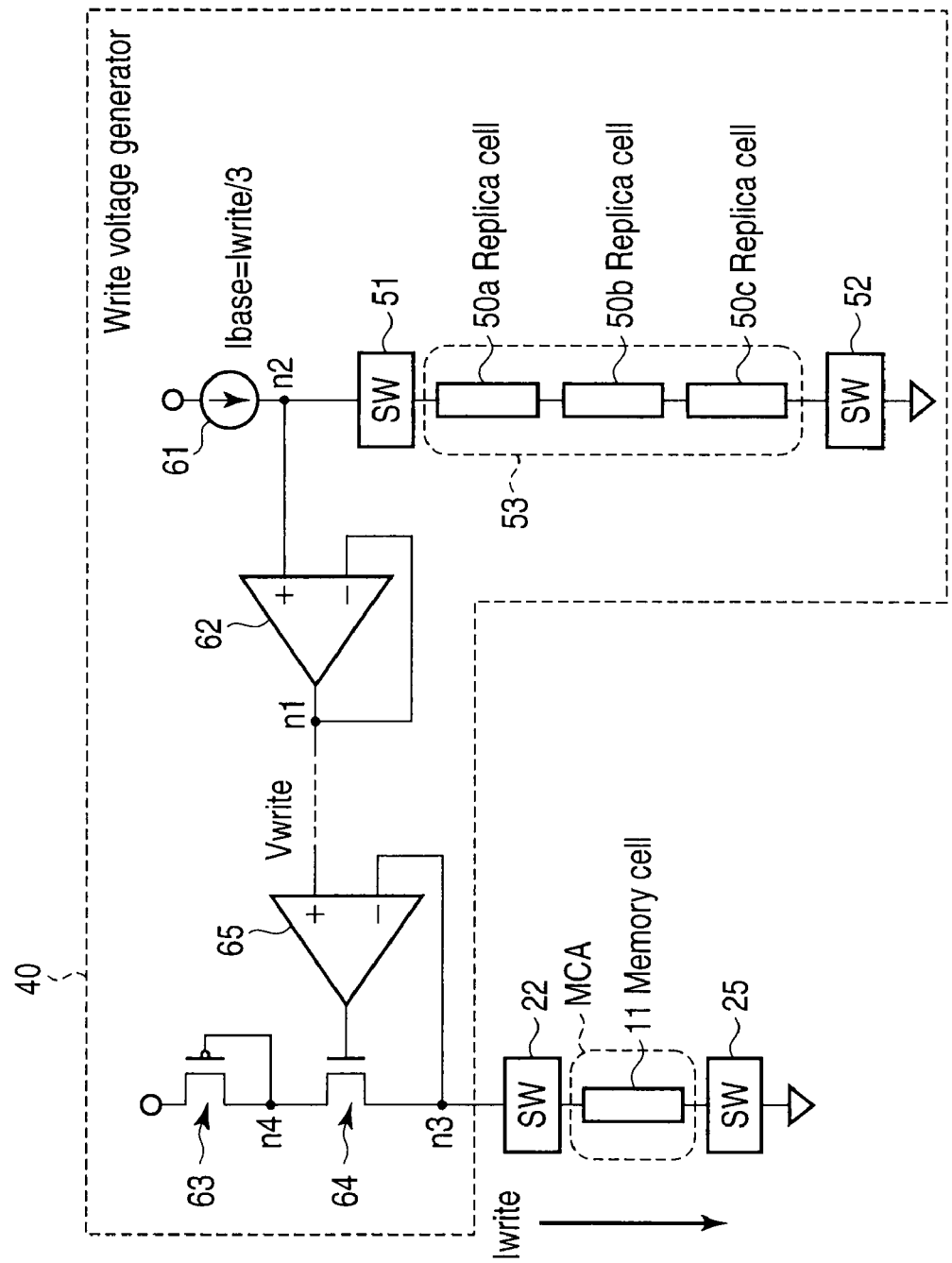
F I G. 11

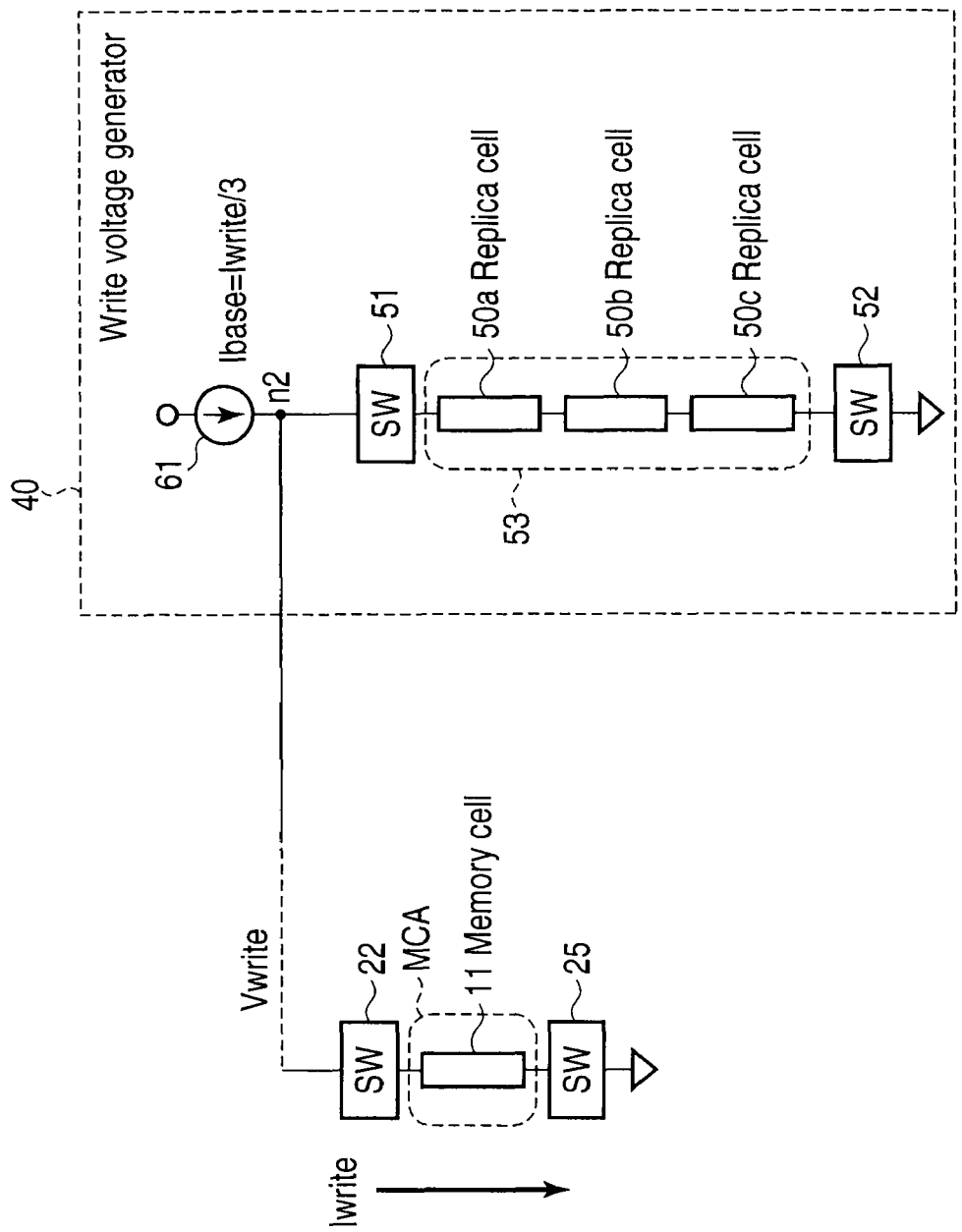
F I G. 12

… (1)

RESISTANCE CHANGE MEMORY

CROSS-REFERENCE TO RELATED APPLICATIONS

This application is based upon and claims the benefit of priority from prior Japanese Patent Application No. 2007-260241, filed Oct. 3, 2007, the entire contents of which are incorporated herein by reference.

BACKGROUND OF THE INVENTION

1. Field of the Invention

The present invention relates to a resistance change memory, e.g., a write-system circuit of a resistance change memory.

2. Description of the Related Art

A magnetoresistive element is known as a nonvolatile memory element. The magnetoresistive element includes a free layer and fixed layer as magnetic materials, and a nonmagnetic layer sandwiched between them, and takes different resistance states in accordance with the directions of magnetization in the free layer. A magnetoresistive random access memory (MRAM) is a resistance change memory that stores data by using the difference between the resistance states.

As a data write method, a so-called spin transfer torque writing method different from the conventional so-called magnetic field writing method using a current magnetic field has been proposed (e.g., U.S. Pat. No. 5,695,864).

In spin transfer torque writing, a flow of electrons spin-polarized by the magnetic moment in the fixed layer of the magnetoresistive element is supplied to the free layer. Since the magnetization direction in the free layer changes in accordance with the direction of this electron flow, specific data is written in the magnetoresistive element. Unlike the magnetic field writing method, the spin transfer torque writing method can directly act on the magnetoresistive element. Therefore, no write error occurs in any adjacent memory cell. There is another advantage that the current amount necessary for write reduces as the cell size decreases.

Data is read out by supplying a read current to the magnetoresistive element, converting the resistance value into a current value or voltage value, and comparing the value with a reference value.

The magnetic field writing method and spin transfer torque writing method use the same mechanism to hold data in the magnetoresistive element. Accordingly, a partial peripheral circuit configuration can be used in both MRAMs using the two writing methods. However, since the principles of write are different, the two writing methods require some different peripheral circuits. Therefore, demands have arisen for the implementation of a write-system circuit capable of generating a high-accuracy write voltage suited to the spin transfer torque writing method.

BRIEF SUMMARY OF THE INVENTION

A resistance change memory according to the first aspect of the present invention comprising a memory cell which is connected to a first node, and programmed from a first resistance state to a second resistance state; a first replica cell which is connected to a second node, generates a write voltage for programming from the first resistance state to the second resistance state, and is fixed in the first resistance state; and a first constant-current source connected to the second node, wherein when writing the second resistance state in the memory cell, a voltage of the first node is held equal to that of the second node.

A resistance change memory according to the second aspect of the present invention comprising a memory cell which is connected to a first node, and programmed from a first resistance state to a second resistance state; a plurality of first replica cells which are connected to a second node, generate a write voltage for programming from the first resistance state to the second resistance state, and are connected in series with each other; and a constant-current source connected to the second node, wherein when writing the second resistance state in the memory cell, a voltage of the first node is held equal to that of the second node.

BRIEF DESCRIPTION OF THE SEVERAL VIEWS OF THE DRAWING

FIG. 1 is a circuit diagram showing the main circuit configuration of a magnetoresistive random access memory according to the first embodiment of the present invention;

FIG. 6 is an exemplary view for explaining a 0-write operation according to the first embodiment of the present invention;

FIG. 7 is an exemplary view for explaining a 1-write operation according to the first embodiment of the present invention;

FIG. 11 is an exemplary view showing practical example 2 of the write voltage generator according to the second embodiment of the present invention; and FIG. 12 is an exemplary view showing another write voltage generator according to the second embodiment of the present invention.

DETAILED DESCRIPTION OF THE INVENTION

Figure 2:
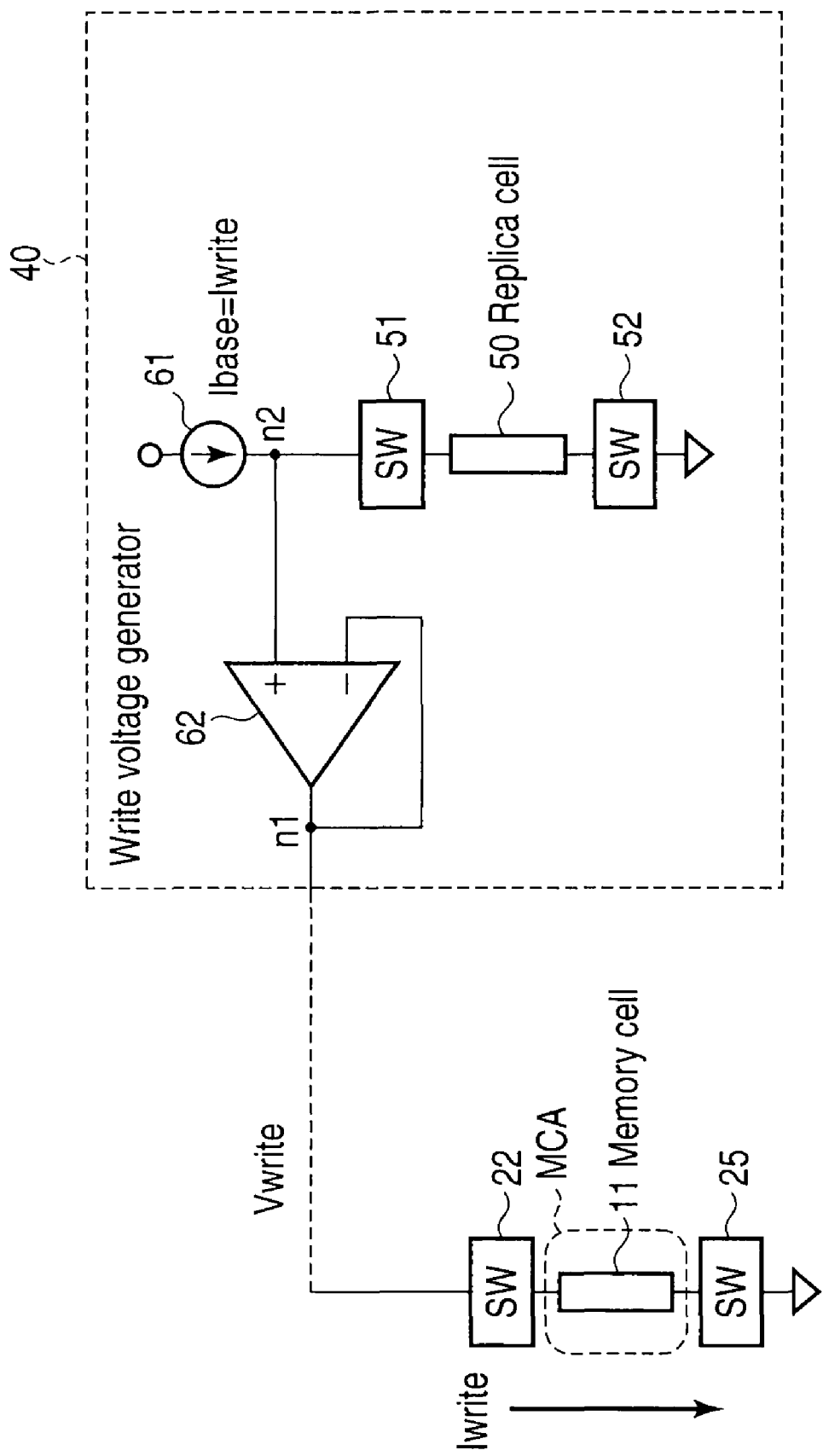
FIG. 2 is an exemplary view showing practical example 1 of a write voltage generator according to the first embodiment of the present invention.

Embodiments of the present invention will be explained below with reference to the accompanying drawing. In the following explanation, the same reference numerals denote the same parts throughout the drawing.

[1] First Embodiment

The first embodiment is an example in which a write circuit includes a replica cell for generating a voltage for programming a memory cell, and the voltage of a node connected to the memory cell is made equal to that of a node connected to the replica cell and a current source during data write.

[1-1] Main Circuit Configuration

FIG. 1 is a circuit diagram showing the main circuit configuration of a magnetoresistive random access memory according to the first embodiment of the present invention. The main circuit configuration of the magnetoresistive random access memory according to the first embodiment will be explained below.

As shown in FIG. 1, a memory cell 11 includes a magnetoresistive element 1 and selection transistor 2 connected in series. The selection transistor 2 is, e.g., an n-type MOSFET (Metal Oxide Semiconductor Field Effect Transistor). The magnetoresistive element 1 is, e.g., an MTJ (Magnetic Tunnel Junction) element. The magnetoresistive element 1 is configured to take a low-resistance state or high-resistance state when a flow of spin-polarized electrons (a spin-polarized electric current) is supplied from one terminal to the other or vice versa. The magnetoresistive element 1 can store binary data by making one of the two resistance states correspond to data "0" and the other correspond to data "1". Details of the magnetoresistive element 1 will be described later.

A memory cell array MCA is formed by arranging the memory cells 11 in, e.g., a matrix. The magnetoresistive random access memory is designed to be able to supply, to the magnetoresistive element 1 of an arbitrary memory cell 11, an electric current flowing in a direction to set the magnetoresistive element 1 in the low-resistance state, and an electric current flowing in a direction to set the magnetoresistive element 1 in the high-resistance state. Various configurations can supply such electric currents, so the present invention is not limited to any configuration. An example will be explained below.

In the memory cell array MCA as shown in FIG. 1, word lines 12 run in the row direction, and bit lines 21 and 24 run in the column direction. In the periphery of the memory cell array MCA, a row decoder 13 and peripheral circuits 23 and 26 are arranged.

The gate electrodes of the selection transistors 2 in the same row (or column) are connected to the same word line 12. The word line 12 in each row is connected to the row decoder 13. The row decoder 13 specifies a word line 12 by using an address signal supplied from outside the magnetoresistive random access memory. When the selected word line 12 is activated, the selection transistor 2 connected to the selected word line 12 is turned on.

One terminal (e.g., the right terminal) of each of a plurality of memory cells 11 in the same column (or row) is connected to the bit line 21. Each bit line 21 is connected to the peripheral circuit 23 via a switching circuit 22 such as a transistor. The switching circuit 22 is turned on or off in accordance with a signal corresponding to an address signal that specifies the memory cell 11 as an object of write or read. When the switching circuit 22 connected to the bit line 21 connected to the memory cell 11 as the object of write or read is turned on, the peripheral circuit 23 is electrically connected to the memory cell 11 as the object.

The other terminal (e.g., the left terminal) of each of a plurality of memory cells in the same column (or row) is connected to the bit line 24. Each bit line 24 is connected to the peripheral circuit 26 via a switching circuit 25 such as a transistor. The switching circuit 25 is turned on or off in accordance with a signal corresponding to an address signal. When the switching circuit 25 connected to the bit line 24 connected to the memory cell 11 as an object is turned on, the peripheral circuit 26 is electrically connected to the memory cell 11 as the object of write or read.

The peripheral circuit 23 includes, e.g., a write circuit 31 and read circuit 32. The peripheral circuit 26 includes, e.g., a write circuit 33.

The write circuits 31 and 33 each include a current source/sink circuit. This current source/sink circuit has a function of supplying an electric current to the connected bit line 21 or 24, and a function of extracting an electric current from the bit line 21 or 24. More specifically, when writing data in a certain memory cell 11, the selection transistor 2 connected to the memory cell 11 is turned on, and the switching circuits 22 and 25 connected to the bit lines 21 and 24 of a memory cell string including the memory cell 11 are turned on. One of the current source/sink circuits (write circuits 31 and 33) which corresponds to write data functions as a current source circuit, and the other functions as a current sink circuit. Consequently, a write current flows between the write circuits 31 and 33 via the switching circuit 22, bit line 21, memory cell 11, bit line 24, and switching circuit 25. The circuit functioning as a current source circuit includes a write voltage generator 40. Details of the write voltage generator 40 will be described later.

The read circuit 32 has at least a supply circuit for supplying a read current and a sense amplifier. In a read operation, the supply circuit supplies, to the magnetoresistive element 1, an electric current having a value that allows the magnetoresistive element 1 to detect data stored in accordance with the magnetization configuration. The sense amplifier determines the resistance state by supplying an electric current to the magnetoresistive element 1.

Note that in the example shown in FIG. 1, the write circuits 31 and 33 are arranged in the two ends of the memory cell array MCA. However, the write circuits 31 and 33 can be implemented in any form as long as bidirectional electric currents can be supplied to the memory cell 11 as described above. For example, both the write circuits 31 and 33 can also be arranged on the upper or lower side of the memory cell array MCA. In this arrangement, the switching circuits 22 and 25 are also arranged on the upper or lower side of the memory cell array MCA, i.e., on the same side as the write circuits 31 and 33.

Note also that in the example shown in FIG. 1, the read circuit 32 is connected to the upper end of the bit line 21, but the connection form is not limited to this. The read circuit 32 can be implemented in any form as long as the resistance state can be determined by supplying the read current to the magnetoresistive element 1. For example, the read circuit 32 may also be connected to the lower end of the bit line 21, or to the bit line 24. Furthermore, in the example shown in FIG. 1, the read circuit 32 is positioned such that the read current flows from the selection transistor 2 to the magnetoresistive element 1. However, the read circuit 32 may also be positioned such that the read current flows from the magnetoresistive element 1 to the selection transistor 2.

[1-2] Write Voltage Generator

Figure 3:
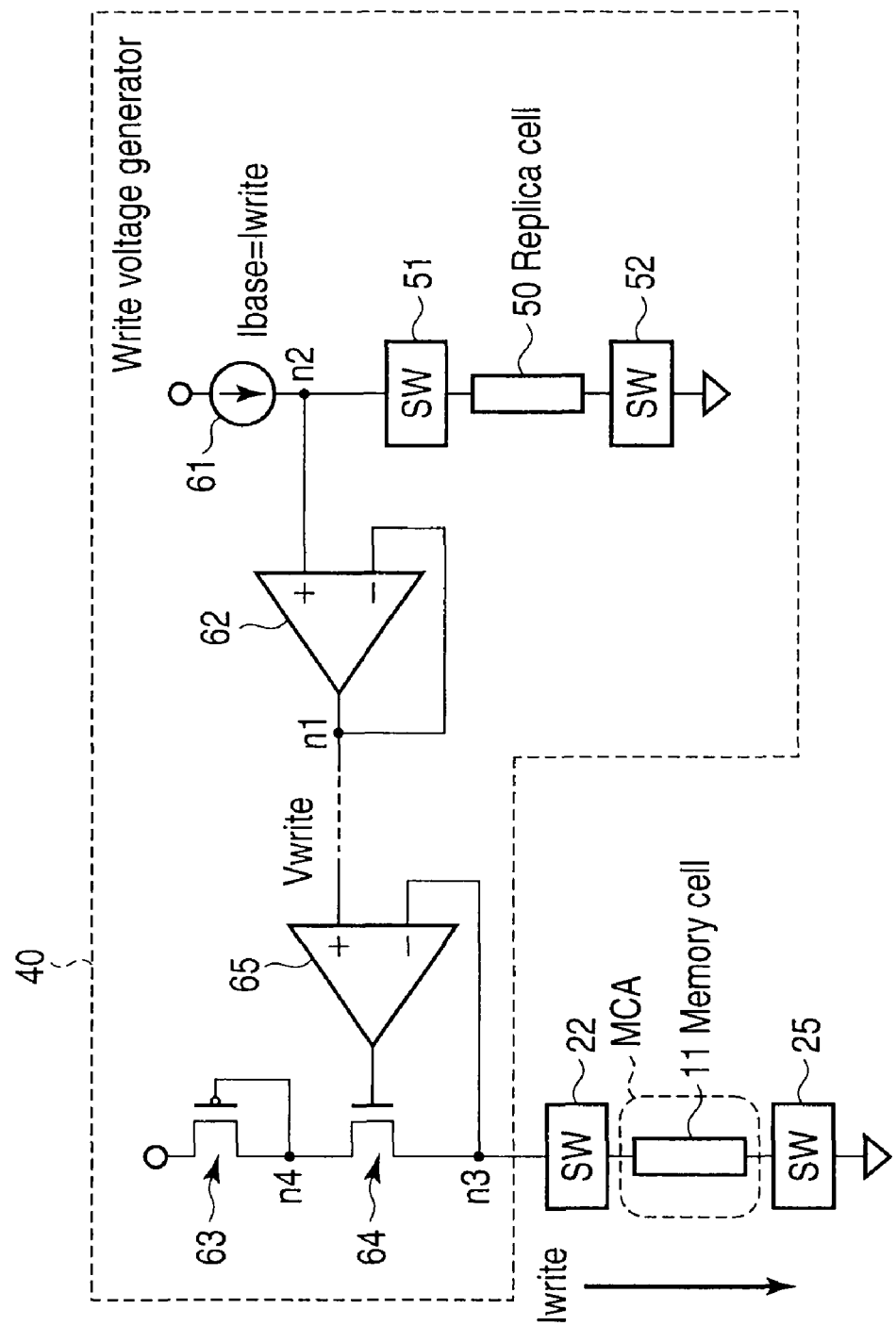
FIG. 3 is an exemplary view showing practical example 2 of the write voltage generator according to the first embodiment of the present invention.

When writing data in the memory cell 11 in this embodiment, a write current Iwrite is supplied to the memory cell 11 in a direction corresponding to the data to be written. For this purpose, a constant write voltage Vwrite is applied to the memory cell 11. The write voltage generator 40 as shown in FIGS. 2 and 3 generates the write voltage Vwrite. The write voltage generator 40 is included in each of the write circuits 31 and 33 shown in FIG. 1.

The write voltage generator 40 converts a base current Ibase having the same value as that of the write current Iwrite necessary for write into a voltage by using a load resistance. To supply a desired write current Iwrite to the memory cell 11, the load resistance is made equal to the resistance of the memory cell 11. In addition, a replica cell 50 as a replica of the memory cell 11 is formed as the load resistance in order to compensate for resistance fluctuations with respect to the manufacture and temperature of the memory cell 11.

Practical examples of the write voltage generator 40 as described above will be explained below with reference to FIGS. 2 and 3.

Practical Example 1

As shown in FIG. 2, the write voltage generator 40 of practical example 1 comprises the replica cell 50, switching circuits 51 and 52, a constant-current source 61, and an operational amplifier 62.

The replica cell 50 has the same arrangement as that of the memory cell 11. That is, the replica cell 50 includes a magnetoresistive element 1 and selection transistor 2 connected in series shown in FIG. 1. The selection transistor 2 is, e.g., an n-type MOSFET. The magnetoresistive element 1 is, e.g., an MTJ element. The replica cell 50 is formed simultaneously with the memory cell 11 in the same step by using the same materials, so as to have the same shape and structure as those of the memory cell 11. In principle, therefore, the magnetoresistive element 1 of the memory cell 11 and the magnetoresistive element 1 of the replica cell 50 have the same characteristics. That is, when the difference between the characteristics caused by, e.g., variations in the manufacturing process is not taken into consideration, the two magnetoresistive elements 1 have the same resistance value in the same resistance state (the low- or high-resistance state). Even when the variations in characteristics of the two elements are taken into account, practically the same resistance value appears. Also, magnetization in the magnetoresistive element 1 of the replica cell 50 is set in the low- or high-resistance state in accordance with data written in the memory cell 11. Details of the replica cell 50 will be described later.

The switching circuits 51 and 52 are transistors or the like. The switching circuit 51 has one terminal connected to one terminal of the replica cell 50, and the other terminal connected to the constant-current source 61. The switching circuit 52 has one terminal connected to the other terminal of the replica cell 50, and the other terminal connected to a ground terminal.

The constant-current source 61 supplies the base current Ibase having the same value as that of the write current Iwrite flowing through the memory cell 11. Temperature compensation may also be performed on the base current Ibase in order to optimize the write current Iwrite.

A positive input terminal (+) of the operational amplifier 62 is connected to a connection node n2 between the constant-current source 61 and switching circuit 51. An inverting input terminal (−) of the operational amplifier 62 is connected to a node n1 of its own output terminal. The node n1 is connected to one terminal of the switching circuit 22 connected to the memory cell 11.

In the write voltage generator 40 of practical example 1 as described above, the voltage of the node n1 connected to the memory cell 11 is held equal to that of the node n2 connected to the constant-current source 61 when writing data in the memory cell 11.

Practical Example 2

As shown in FIG. 3, the write voltage generator 40 of practical example 2 further comprises a p-type transistor (e.g., a MOSFET) 63, an n-type transistor (e.g., a MOSFET) 64, and an operational amplifier 65 in addition to the arrangement of practical example 1.

One end of the current path of the transistor 63 is connected to a power supply terminal. The other end of the current path of the transistor 63 is connected to its own gate terminal, and a connection node n4 is connected to one end of the current path of the transistor 64. The other end of the current path of the transistor 64 is connected to the switching circuit 22.

A node n1 is connected to a positive input terminal (+) of the operational amplifier 65, and applies the write voltage Vwrite. An inverting input terminal (−) of the operational amplifier 65 is connected to a connection node n3 between the transistor 64 and switching circuit 22. The output terminal of the operational amplifier 65 is connected to the gate terminal of the transistor 64.

In the write voltage generator 40 of practical example 2 as described above, the voltages of the nodes n1 and n3 connected to the memory cell 11 are held equal to that of the node n2 connected to the constant-current source 61 when writing data in the memory cell 11.

Figure 4:
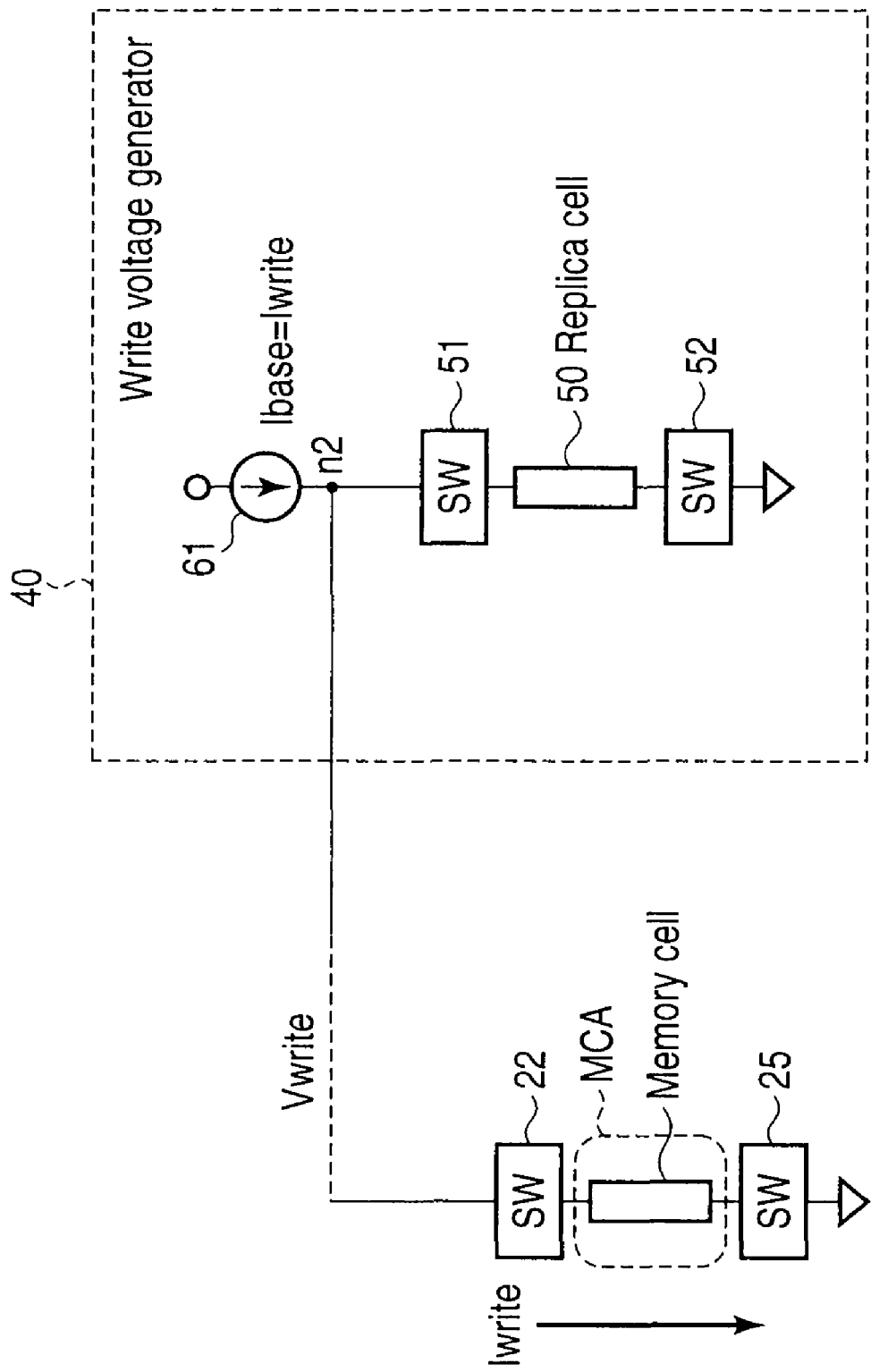
FIG. 4 is an exemplary view showing another write voltage generator according to the first embodiment of the present invention.

Note that as long as the voltage to be applied to the memory cell 11 is held equal to that of the node n2, it is also possible to omit the operational amplifier 62 and the like shown in FIGS. 2 and 3 and directly connect the node n2 to the switching circuit 22 as shown in FIG. 4. However, when the operation amplifier 62, for example, is formed, the operational amplifier 62 charges the node n1 to make its potential equal to that of the node n2. This results in the advantage that the change in potential of the node n2 can be transmitted to the potential of the node n1 within a time shorter than that when there is no operational amplifier 62.

[1-3] Replica Cell

Figure 5:
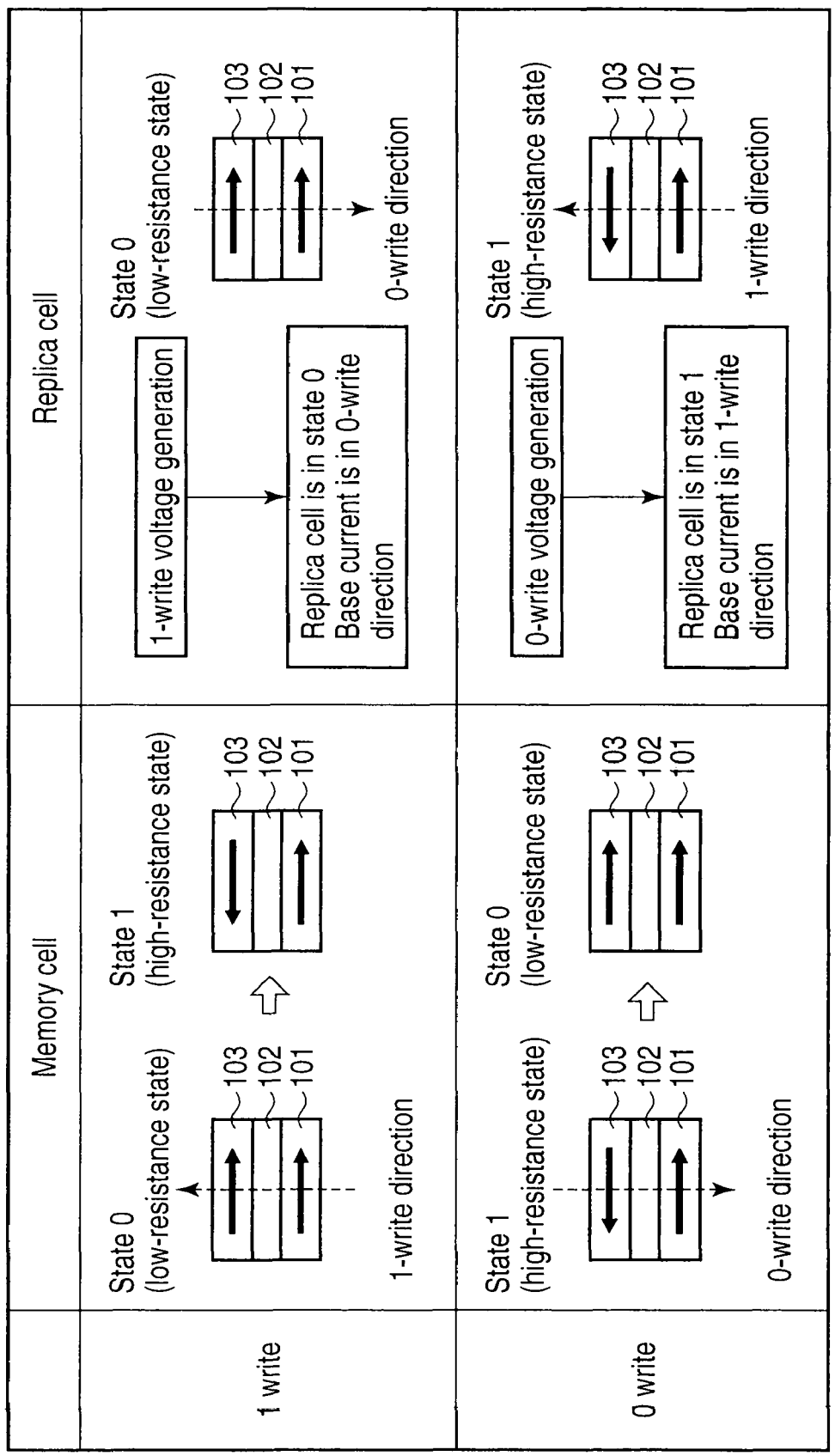
FIG. 5 is a view for explaining a replica cell in a write operation according to the first embodiment of the present invention.

In this embodiment, the base current Ibase is converted into the write voltage Vwrite by using the replica cell 50 as a load resistance in order to generate the write voltage Iwrite required to write data in the memory cell 11. To supply the desired write current Iwrite to the memory cell 11, the resistance of the replica cell 50 is preferably made equal to that of the memory cell 11. An example of the replica cell 50 in the write operation of this embodiment will be explained in detail below with reference to FIG. 5.

(1 Write)

When writing 1 in the memory cell 11, the memory cell 11 can take state 0 or state 1. Programming is necessary only when the memory cell 11 is in state 0. When writing 1, therefore, it is only necessary to assume the case where the memory cell 11 in state 0 is changed to state 1.

Accordingly, when generating a write voltage for 1 write, the replica cell 50 of the write voltage generator 40 is set in "state 0", i.e., the same state as that of the memory cell 11 requiring programming. To avoid a write error in the replica cell 50, the direction of an electric current to be supplied to the replica cell 50 is desirably "a 0-write direction". That is, an electric current is preferably supplied to the magnetoresistive element 1 of the replica cell 50 in a direction from a free layer 103 to a fixed layer 101.

(0 Write)

When writing 0 in the memory cell 11, the memory cell 11 can take state 0 or state 1. Programming is necessary only when the memory cell 11 is in state 1. When writing 0, therefore, it is only necessary to assume the case where the memory cell 11 in state 1 is changed to state 0.

Accordingly, when generating a write voltage for 0 write, the replica cell 50 of the write voltage generator 40 is set in "state 1", i.e., the same state as that of the memory cell 11 requiring programming. To avoid a write error in the replica cell 50, the direction of an electric current to be supplied to the replica cell 50 is desirably "a 1-write direction". That is, an electric current is preferably supplied to the magnetoresistive element 1 of the replica cell 50 in a direction from the fixed layer 101 to the free layer 103.

[1-4] Write Operation

Referring to FIGS. 6 and 7, a 0-write voltage generator 40_0 for generating a 0-write voltage and a 1-write voltage generator 40_1 for generating a 1-write voltage are arranged on the two sides of the memory cell array MCA. Switching circuits 71 and 72 such as transistors are respectively arranged between the write voltage generator 40_0 and switching circuit 22 and between the write voltage generator 40_1 and switching circuit 25. The switching circuit 71 can be connected to a node n1 of the 0-write voltage generator 40_0 or to the ground terminal. The switching circuit 72 can be connected to a node n1 of the 1-write voltage generator 40_1 or to the ground terminal.

The write operation will be explained below with reference to FIGS. 6 and 7.

(0 Write)

As shown in FIG. 6, when writing 0 in the memory cell 11, an electric current is supplied to the memory cell 11 in the 0-write direction (rightward in the drawing surface). To connect the 0-write voltage generator 40_0 on the left side to the memory cell 11, the switching circuit 71 is connected to the node n1 of the 0-write voltage generator 40_0, and the switching circuit 72 is connected to the ground terminal. Accordingly, a write voltage Vwrite_0 for 0 write generated by the 0-write voltage generator 40_0 is used to write 0 in the memory cell 11.

The write voltage Vwrite_0 for 0 write is generated by converting a base current Ibase_0 having the same value as that of an electric current required for write into a voltage by using a replica cell 50_0 as a load resistance. More specifically, an electric current is supplied in a direction to write 1 (a direction from the fixed layer to the free layer) to the replica cell 50_0 set in state 1 by the base current Ibase_0 of a constant-current source 61_0. Consequently, the write voltage Vwrite_0 is generated in a connection node n2. Since the write voltage Vwrite_0 is held at the same value in the node n1 as well, the write voltage Vwrite_0 having a desired value can be applied to the memory cell 11. Accordingly, the write current having the desired value flows through the memory cell 11, and 0 is written in it.

Note that in this case, one terminal of the switching circuit 72 is connected to the ground terminal, so the 1-write voltage generator 40_1 is not connected to the memory cell 11.

(1 Write)

As shown in FIG. 7, when writing 1 in the memory cell 11, an electric current is supplied to the memory cell 11 in the 1-write direction (leftward in the drawing surface). To connect the 1-write voltage generator 40_1 on the right side to the memory cell 11, the switching circuit 71 is connected to the ground terminal, and the switching circuit 72 is connected to the node n1 of the 1-write voltage generator 40_1. Accordingly, a write voltage Vwrite_1 for 1 write generated by the 1-write voltage generator 40_1 is used to write 1 in the memory cell 11.

The write voltage Vwrite_1 for 1 write is generated by converting a base current Ibase_1 having the same value as that of an electric current required for write into a voltage by using a replica cell 50_1 as a load resistance. More specifically, an electric current is supplied in a direction to write 0 (a direction from the free layer to the fixed layer) to the replica cell 50_1 set in state 0 by the base current Ibase_1 of a constant-current source 61_1. Consequently, the write voltage Vwrite_1 is generated in a connection node n2. Since the write voltage Vwrite_1 is held at the same value in the node n1 as well, the write voltage Vwrite_1 having a desired value can be applied to the memory cell 11. Accordingly, the write current having the desired value flows through the memory cell 11, and 1 is written in it.

Note that in this case, one terminal of the switching circuit 71 is connected to the ground terminal, so the 0-write voltage generator 40_0 is not connected to the memory cell 11.

Referring to FIGS. 6 and 7, the example shown in FIG. 2 is used as each of the write voltage generators 40_0 and 40_1, but the arrangement is not limited to this. The write voltage generator 40 shown in FIG. 3 or 4 may also be used. Furthermore, in FIGS. 6 and 7, one of the write voltage generators 40_0 and 40_1 which generates a higher one of the 1-write voltage and 0-write voltage may also be used for both 1 write and 0 write.

[1-5] Read Operation

The read operation of this embodiment uses the magnetoresistive effect.

The transistor 2 of a selected cell is turned on by selecting the bit lines 21 and 24 and word line 12 corresponding to the selected cell. Then, a read current is supplied to the magnetoresistive element 1 of the selected cell. The resistance value of the magnetoresistive element 1 is read out on the basis of this read current, and whether the recording state is "0" or "1" is determined by an amplifying operation via a sense amplifier.

Note that in the read operation, a current value can be read out by applying a constant voltage, or a voltage value can be read out by supplying a constant current.

[1-6] Magnetoresistive Element

The magnetoresistive element 1 applicable to the memory cell 11 and replica cell 50 of this embodiment will be explained below with reference to FIG. 8.

The magnetoresistive element 1 can take two steady states in accordance with the spin transfer torque magnetization reversing method. More specifically, as shown in FIG. 8, the magnetoresistive element 1 has at least the fixed layer 101, the free layer (recording layer) 103, and an interlayer 102 formed between the fixed layer 101 and free layer 103. It is also possible to form an upper electrode 105 on that surface of the free layer 103 which is away from the interlayer 102, and a lower electrode 106 on that surface of an antiferromagnetic layer 104 which is away from the fixed layer 101.

The fixed layer 101 is made of a ferromagnetic material, and has a fixed magnetization direction. For example, magnetization in the fixed layer 101 can be fixed by forming the antiferromagnetic layer 104 on that surface of the fixed layer 101 which is away from the interlayer 102.

The free layer 103 is made of a ferromagnetic material. No such fixing mechanism as that for the fixed layer 101 is formed for the magnetization direction in the free layer 103. Therefore, the magnetization direction in the free layer 103 is variable.

The interlayer 102 is made of a nonmagnetic material. The interlayer 102 desirably has a film thickness that spaces the fixed layer 101 and free layer 103 apart from each other to such an extent that the direct interaction acting between the fixed layer 101 and free layer 103 is negligible. At the same time, the film thickness of the interlayer 102 is desirably smaller than the spin diffusion length because when a write current is supplied to the magnetoresistive element 1, conduction electrons transmitted through the fixed layer 101 must not reverse the electron spin direction before reaching the free layer 103. As the interlayer 102, it is possible to use, e.g., a nonmagnetic metal, nonmagnetic semiconductor, or insulating film.

Figure 8:
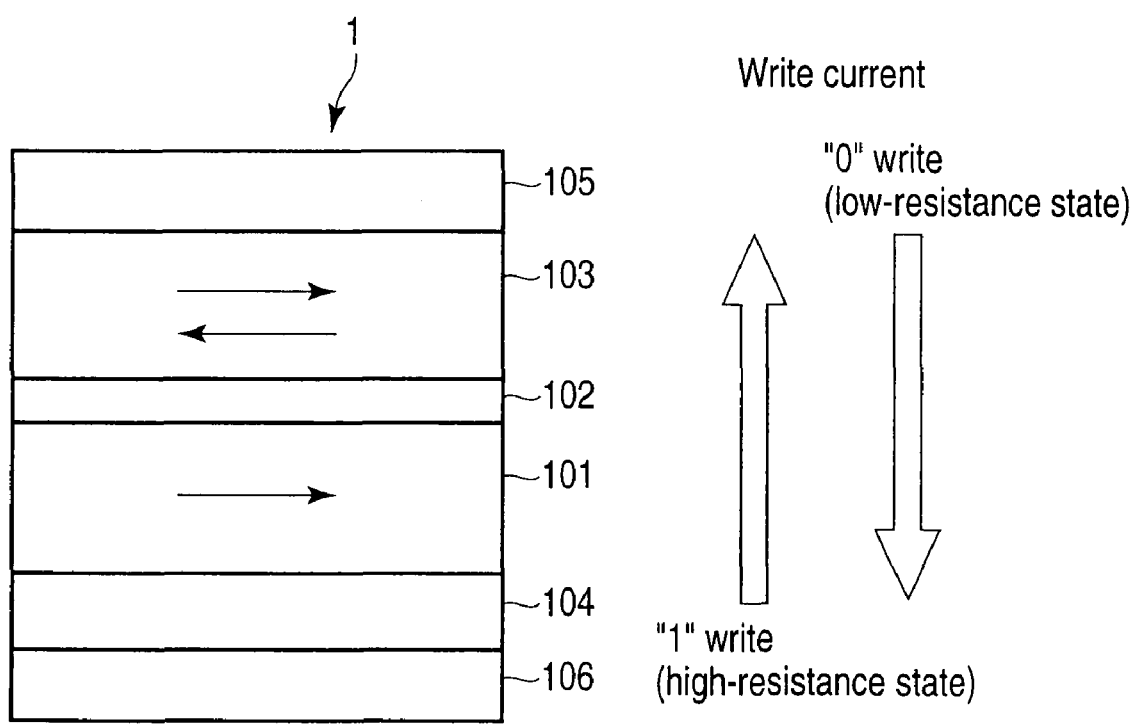
FIG. 8 is a sectional view showing a magnetoresistive element according to the first embodiment of the present invention.

Note that each of the fixed layer 101 and free layer 103 is not limited to a single layer as shown in FIG. 8. For example, at least one of the fixed layer 101 and free layer 103 may also have a stacked structure including a plurality of ferromagnetic layers.

In addition, at least one of the fixed layer 101 and free layer 103 may also have an antiferromagnetic coupling structure which includes three layers, i.e., a first ferromagnetic layer/ nonmagnetic layer/second ferromagnetic layer, and in which the first and second ferromagnetic layers are magnetically coupled (by interlayer exchange coupling) so that their magnetization directions are antiparallel, or a ferromagnetic coupling structure in which the first and second ferromagnetic layers are magnetically coupled (by interlayer exchange coupling) so that their magnetization directions are parallel.

A double-junction structure may also be used. A magnetoresistive element having the double-junction structure includes a first fixed layer, a second fixed layer, a free layer, a first interlayer formed between the first fixed layer and free layer, and a second interlayer formed between the second fixed layer and free layer. Compared to a single-junction structure, the double-junction structure has the advantage that it is possible to further increase the ratio of a resistance value in the low-resistance state to that in the high-resistance state, i.e., a so-called MR ratio (Magneto-Resistance ratio).

Next, practical examples of the materials of the magnetoresistive element 1 will be explained.

As the ferromagnetic material of the fixed layer 101 and free layer 103, it is possible to use, e.g., Co, Fe, Ni, or an alloy containing any of these metals.

When using a nonmagnetic metal as the interlayer 102, it is possible to use any of Au, Cu, Cr, Zn, Ga, Nb, Mo, Ru, Pd, Ag, Hf, Ta, W, Pt, and Bi, or an alloy containing at least one of these metals. Note that when allowing the interlayer 102 to function as a tunnel barrier layer, it is possible to use an insulating oxide such as $Al_2O_3$, $SiO_2$, MgO, or AlN.

As the material of the antiferromagnetic layer 104, it is possible to use, e.g., Fe—Mn, Pt—Mn, Pt—Cr—Mn, Ni—Mn, Pd—Mn, NiO, $Fe_2O_3$, or a magnetic semiconductor.

The parallel and antiparallel magnetization configurations of the magnetoresistive element 1 resulting from spin transfer torque writing will be explained below with reference to FIG. 8.

When reversing the magnetization direction in the free layer 103 which is antiparallel to that in the fixed layer 101, thereby making the former parallel to the latter, an electron flow is supplied from the fixed layer 101 to the free layer 103. That is, a write current is supplied from the free layer 103 to the fixed layer 101. Generally, many electrons in an electron flow passing through a certain magnetic material have spins parallel to the magnetization direction in this magnetic material. Therefore, many electrons in the electron flow having passed through the fixed layer 101 have spins parallel to the magnetization direction in the fixed layer 101. This electron flow mainly contributes to the torque acting on magnetization in the free layer 103. Not that the rest of electrons in the electron flow have spins antiparallel to the magnetization direction in the fixed layer 101. Consequently, the magnetization directions in the fixed layer 101 and free layer 103 take the parallel state (low-resistance state). This case is defined as state "0" in this embodiment.

On the other hand, when reversing the magnetization direction in the free layer 103 which is parallel to the magnetization direction in the fixed layer 101, thereby making the former antiparallel to the latter, an electron flow is supplied from the free layer 103 to the fixed layer 101. That is, a write current is supplied from the fixed layer 101 to the free layer 103. This electron flow is transmitted through the free layer 103, and many electrons having spins antiparallel to the magnetization direction in the fixed layer 101 are reflected by the fixed layer 101, and return to the free layer 103. These electrons having spins antiparallel to the magnetization direction in the fixed layer 101 flow into the free layer 103 again, and mainly contribute to the torque acting on magnetization in the free layer 103. Note that some electrons transmitted through the free layer 103 and having spins antiparallel to the magnetization direction in the fixed layer 101 are transmitted through the fixed layer 101, although the number of these electrons is small. Consequently, the magnetization directions in the fixed layer 101 and free layer 103 take the antiparallel state (high-resistance state). This case is defined as state "1" in this embodiment.

In the spin transfer torque writing described above, the resistance state of the magnetoresistive element 1 is made to correspond to the logic level to be stored such that the case where the magnetization directions in the fixed layer 101 and free layer 103 take the parallel state (low-resistance state) is regarded as state "0", and the case where the magnetization directions in the fixed layer 101 and free layer 103 take the antiparallel state (high-resistance state) is regarded as state "1". However, it is of course also possible to make the parallel and antiparallel states respectively correspond to states "1" and "0".

Referring to FIG. 8, the magnetization directions in the fixed layer 101 and free layer 103 of the magnetoresistive element 1 are parallel to the film surfaces, thereby forming an in-plane magnetization type element (parallel magnetization type element). However, the magnetoresistive element 1 may also be a perpendicular magnetization type element in which these magnetization directions are perpendicular to the film surfaces. Note that the perpendicular magnetization type element is suitable for micropatterning because the element shape need not be controlled in order to determine the magnetization direction unlike in the in-plane magnetization type element.

[1-7] Cell Structure

An example of the structure of the memory cell 11 and replica cell 50 will be explained below with reference to FIG. 9.

Figure 9:
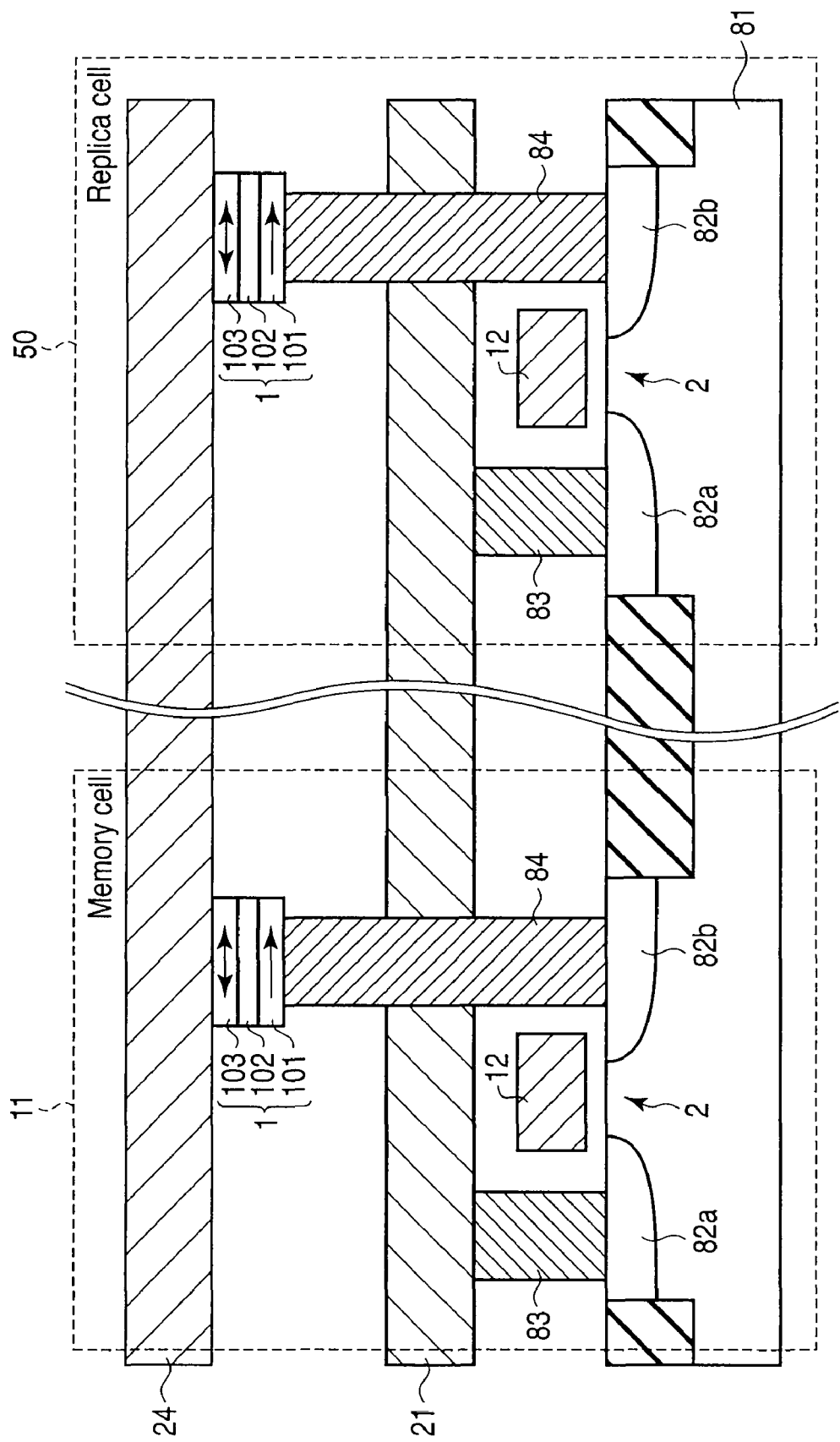
FIG. 9 is a sectional view showing the structures of a memory cell and the replica cell according to the first embodiment of the present invention.

As shown in FIG. 9, the memory cell 11 and replica cell 50 have the same structure and shape. For example, the magnetoresistive elements 1 of the memory cell 11 and replica cell 50 are made of the same materials, and have, e.g., the same sectional shape, planar shape, volume, and film configuration. Also, the transistors 2 of the memory cell 11 and replica cell 50 are made of the same materials and have the same performance and the like.

A practical structure is as follows. A gate electrode G is formed on a semiconductor substrate 81, and source/drain diffusion layers 82a and 82b are formed in the semiconductor substrate 81 on the two sides of the gate electrode G. The gate electrode G is connected to the word line 12. Thus, the transistor 2 is formed on the semiconductor substrate 81. The source/drain diffusion layer 82a is connected to the bit line 21 via a contact 83. The source/drain diffusion layer 82b is connected to the magnetoresistive element 1 via a contact 84. The free layer 103 of the magnetoresistive element 1 is connected to the bit line 24. The bit lines 21 and 24 run parallel to each other.

[1-8] Effects

In the first embodiment described above, the write voltage generator 40 for data write comprises, as a load resistance, the replica call 50 that is a replica of the memory cell 11, in order to supply the desired write current Iwrite to the memory cell 11. The memory cell 11 is connected to the node n1 connected to the write circuit 31, and the replica cell 50 is connected to the node n2 connected to the constant-current source 61. When writing data in the memory cell 11 in this circuit configuration, the voltages of the two nodes n1 and n2 are held equal to each other. This makes it possible to generate a high-accuracy write voltage Vwrite for supplying the defined write current Iwrite to the memory cell 11, regardless of the resistance fluctuation with respect to the manufacture or temperature of the memory cell 11. Note that the resistance fluctuation herein mentioned means the average value, and does not mean the variations of the individual memory cells.

[2] Second Embodiment

The second embodiment is an example of a write voltage generator having an arrangement different from that of the first embodiment.

[2-1] Write Voltage Generator

Figure 10:
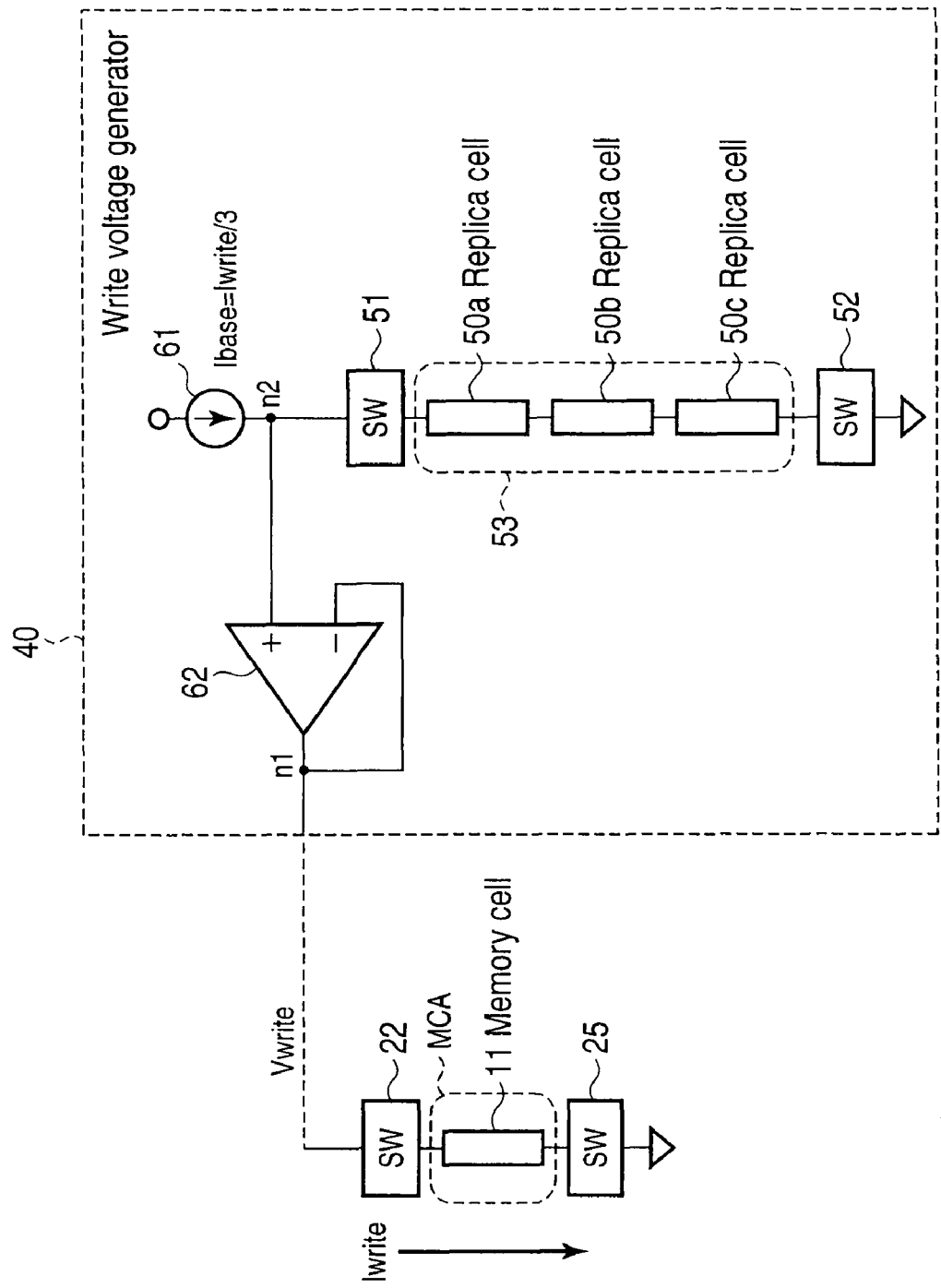
FIG. 10 is an exemplary view showing practical example 1 of a write voltage generator according to the second embodiment of the present invention.

As shown in FIGS. 10 to 12, a write voltage generator 40 of the second embodiment has, as a load resistance, a replica cell group 53 including a plurality of replica cells 50a, 50b, and 50c connected in series. The replica cell group 53 has one terminal connected to a switching circuit 51, and the other terminal connected to a switching circuit 52.

In an example shown in FIG. 10, the write voltage generator 40 comprises the replica cell group 53, the switching circuits 51 and 52, a constant-current source 61, and an operational amplifier 62. In an example shown in FIG. 11, the write voltage generator 40 further comprises a p-type transistor (e.g., a MOSFET) 63, an n-type transistor (e.g., a MOSFET) 64, and an operational amplifier 65 in addition to the arrangement shown in FIG. 10. In an example shown in FIG. 12, the operational amplifier 62 and the like shown in FIGS. 10 and 11 are omitted, and a node n2 and switching circuit 22 are directly connected. Practical connection relationships shown in FIGS. 10 to 12 are the same as those shown in FIGS. 2 to 4, so a repetitive explanation will be omitted.

In the second embodiment as described above, the constant-current source 61 generates a base current Ibase in the node n2, and the series circuit of the three replica cells 50a, 50b, and 50c is connected to the node n2. When writing data, the voltage of the node n2 is applied, via the operational amplifier 62 as a unity gain buffer, to a node n1 connected to a memory cell 11. Note that in order to equalize the resistance of the current path of the memory cell 11 and that of the current path of the replica cell group 53 as much as possible, the dummy switching circuit 51 is desirably inserted in the current path of the replica cell group 53.

In this embodiment, the base current Ibase generated by the constant-current source 61 is set at a value ⅓ that of a write current Iwrite sufficient to rewrite stored data of the memory cell 11. Since the three replica cells 50a, 50b, and 50c each having a resistance R_rep are connected in series, a voltage Vn2 of the node n2 is given by $$Vn2 = 3R\_rep \times \tfrac{1}{3} Ibase$$

$$Vn2 = R\_rep \times Ibase = Vwrite \qquad (1)$$

Since a voltage Vn1 of the node n1 is equal to the voltage Vn2 of the node n2, therefore, if the resistance value R_rep of each of the replica cells 50a, 50b, and 50c and a resistance value R_cell of the memory cell 11 are equal, the write current Iwrite having a desired value flows through the memory cell 11.

[2-2] Replica Cell

In the second embodiment, as in the first embodiment, the resistance of each of the replica cells 50a, 50b, and 50c is desirably made equal to that of the memory cell 11, in order to supply the desired write current Iwrite to the memory cell 11.

More specifically, when generating a write voltage for 1 write in order to write 1 in the memory cell 11, all the replica cells 50a, 50b, and 50c are set in "state 0" that is the same state as that of the memory cell 11 requiring programming. To avoid write errors in the replica cells 50a, 50b, and 50c, the direction of an electric current flowing through the replica cells 50a, 50b, and 50c is preferably set in "a 0-write direction". That is, an electric current flowing from a free layer 103 to a fixed layer 101 is preferably supplied to a magnetoresistive element 1 of each of the replica cells 50a, 50b, and 50c.

On the other hand, when generating a write voltage for 0 write in order to write 0 in the memory cell 11, all the replica cells 50a, 50b, and 50c are set in "state 1" that is the same state as that of the memory cell 11 requiring programming. To avoid write errors in the replica cells 50a, 50b, and 50c, the direction of an electric current flowing through the replica cells 50a, 50b, and 50c is preferably set in "a 1-write direction". That is, an electric current flowing from the fixed layer 101 to the free layer 103 is preferably supplied to the magnetoresistive element 1 of each of the replica cells 50a, 50b, and 50c.

Note that the rest of the arrangement of the second embodiment may also be the same as that of the first embodiment. That is, in the second embodiment, the main circuit configuration of a magnetoresistive random access memory may also be the same as that shown in FIG. 1. In addition, practical write of the second embodiment may also be performed by arranging the write voltage generators 40 on the two sides of the memory cell 11 as shown in FIGS. 6 and 7. Furthermore, each of the replica cells 50a, 50b, and 50c of the second embodiment may also have the same structure and shape as those of the memory cell 11 as in the first embodiment.

[2-3] Effects

In the second embodiment described above, the voltages of the two nodes n1 and n2 are held equal to each other when writing data in the memory cell 11, as in the first embodiment. This makes it possible to generate a high-accuracy write voltage Vwrite for supplying the defined write current Iwrite to the memory cell 11, regardless of the resistance fluctuation with respect to the manufacture or temperature of the memory cell 11.

Also, in the second embodiment, the series circuit of the three replica cells 50a, 50b, and 50c is formed as a load resistance of the write voltage generator 40. Accordingly, the base current Ibase flowing through the replica calls 50a, 50b, and 50c is ⅓ the write current Iwrite, and the voltage applied to the replica cells 50a, 50b, and 50c is also ⅓ the write voltage Vwrite. This makes it possible to reduce the stress to the replica cells 50a, 50b, and 50c, and suppress deterioration of the magnetoresistive element 1 forming each of the replica cells 50a, 50b, and 50c.

Note that the three replica cells 50a, 50b, and 50c are connected in series in this embodiment, but N replica cells may also be connected in series. N is a natural number of 2 or more. In this case, the same effects as above can be obtained by making the base current Ibase 1/N the write current Iwrite.

The present invention is not limited to the above embodiments, and can be variously modified without departing from the spirit and scope of the invention when practiced. For example, each embodiment is explained by taking a magnetoresistive random access memory using a magnetoresistive element as an example. However, the present invention is also applicable to resistance change memories such as a PRAM (Phase-change Random Access Memory) using a chalcogenide element, and an ReRAM (Resistance Random Access Memory) using a transition metal oxide element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change memory comprising:
   a memory cell which is connected to a first node, and programmed from a first resistance state to a second resistance state;
   a first replica cell which is connected to a second node, generates a write voltage for programming from the first resistance state to the second resistance state, and is fixed in the first resistance state; and
   a first constant-current source connected to the second node,
   wherein when writing the second resistance state in the memory cell, a voltage of the first node is held equal to that of the second node.

2. The memory according to claim 1, wherein when writing the second resistance state in the memory cell, an electric current flows through the first replica cell in a direction to write the first resistance state.

3. The memory according to claim 1, in which the memory cell is further connected to a third node, and programmed from the second resistance state to the first resistance state, which further comprises:
   a second replica cell which is connected to a fourth node, generates a write voltage for programming from the second resistance state to the first resistance state, and is fixed in the second resistance state; and
   a second constant-current source connected to the fourth node, and
   in which when writing the first resistance state in the memory cell, a voltage of the third node is held equal to that of the fourth node.

4. The memory according to claim 3, which further comprises:
   a first switching circuit having one terminal connected to one terminal of the memory cell, and the other terminal connected to one of the first node and a ground terminal; and
   a second switching circuit having one terminal connected to the other terminal of the memory cell, and the other terminal connected to one of the third node and a ground terminal, and
   in which when writing the first resistance state in the memory cell, the other terminal of the first switching circuit is connected to the ground terminal, and the other terminal of the second switching circuit is connected to the third node, and
   when writing the second resistance state in the memory cell, the other terminal of the first switching circuit is connected to the first node, and the other terminal of the second switching circuit is connected to the ground terminal.

5. The memory according to claim 1, further comprising a first operational amplifier having an output terminal and an inverting input terminal connected to the first node, and a positive input terminal connected to the second node.

6. The memory according to claim 5, further comprising:
   a second operational amplifier having an inverting input terminal connected to a third node connected to the memory cell, and a positive input terminal connected to the first node;
   a first transistor having a current path having one end connected to the third node and the other end connected to a fourth node, and a gate terminal connected to an output terminal of the second operational amplifier; and
   a second transistor having a current path having one end connected to the fourth node, and a gate terminal connected to the fourth node.

7. The memory according to claim 6, wherein when writing the second resistance state in the memory cell, a voltage of the third node is held equal to that of the second node.

8. The memory according to claim 1, wherein each of the memory cell and the first replica cell includes a magnetoresistive element.

9. The memory according to claim 1, wherein
   each of the memory cell and the first replica cell includes a magnetoresistive element and a transistor connected in series, and
   the magnetoresistive elements of the memory cell and the first replica cell are formed to have the same structure and the same shape, and the transistors of the memory cell and the first replica cell are formed to have the same structure and the same shape.

10. The memory according to claim 1, wherein the constant-current source generates a base current having the same value as that of a write current flowing through the memory cell.

11. A resistance change memory comprising:
    a memory cell which is connected to a first node, and programmed from a first resistance state to a second resistance state;
    a plurality of first replica cells which are connected to a second node, generate a write voltage for programming from the first resistance state to the second resistance state, and are connected in series with each other; and
    a constant-current source connected to the second node,
    wherein when writing the second resistance state in the memory cell, a voltage of the first node is held equal to that of the second node.

12. The memory according to claim 11, wherein the plurality of first replica cells are fixed in the first resistance state.

13. The memory according to claim 12, wherein when writing the second resistance state in the memory cell, an electric current flows through the plurality of first replica cells in a direction to write the first resistance state.

14. The memory according to claim 12, wherein when the number of the plurality of first replica cells is N, a value of a base current generated by the constant-current source is 1/N that of a write current flowing through the memory cell.

15. The memory according to claim 11, in which the memory cell is further connected to a third node, and programmed from the second resistance state to the first resistance state,
which further comprises:
a plurality of second replica cells which are connected to a fourth node, generate a write voltage for programming from the second resistance state to the first resistance state, and are connected in series with each other; and
a second constant-current source connected to the fourth node, and
in which when writing the first resistance state in the memory cell, a voltage of the third node is held equal to that of the fourth node.

16. The memory according to claim 11, further comprising a first operational amplifier having an output terminal and an inverting input terminal connected to the first node, and a positive input terminal connected to the second node.

17. The memory according to claim 16, further comprising:
a second operational amplifier having an inverting input terminal connected to a third node connected to the memory cell, and a positive input terminal connected to the first node;
a first transistor having a current path having one end connected to the third node and the other end connected to a fourth node, and a gate terminal connected to an output terminal of the second operational amplifier; and
a second transistor having a current path having one end connected to the fourth node, and a gate terminal connected to the fourth node.

18. The memory according to claim 17, wherein when writing the second resistance state in the memory cell, a voltage of the third node is held equal to that of the second node.

19. The memory according to claim 11, wherein each of the memory cell and the plurality of first replica cells includes a magnetoresistive element.

20. The memory according to claim 11, wherein
the memory cell and the plurality of first replica cells includes a magnetoresistive element and a transistor connected in series, and
the magnetoresistive elements of the memory cell and the plurality of first replica cells are formed to have the same structure and the same shape, and the transistors of the memory cell and the plurality of first replica cells are formed to have the same structure and the same shape.

* * * * *